(12) United States Patent
Zhong et al.

(10) Patent No.: US 7,527,859 B2
(45) Date of Patent: May 5, 2009

(54) ENHANCED BORON NITRIDE COMPOSITION AND COMPOSITIONS MADE THEREWITH

(75) Inventors: Hong Zhong, New Haven, CT (US); Eric Thaler, Solon, OH (US)

(73) Assignee: Momentive Performance Materials Inc., Albany, NY (US)

( * ) Notice: Subject to any disclaimer, the term of this patent is extended or adjusted under 35 U.S.C. 154(b) by 68 days.

(21) Appl. No.: 11/558,389

(22) Filed: Nov. 9, 2006

(65) Prior Publication Data

US 2008/0076856 A1 Mar. 27, 2008

Related U.S. Application Data

(60) Provisional application No. 60/828,649, filed on Oct. 8, 2006.

(51) Int. Cl.
*B32B 5/66* (2006.01)
(52) U.S. Cl. .............. 428/403; 428/404; 428/405; 428/406; 428/407; 428/323; 427/212
(58) Field of Classification Search ........ 428/403, 428/407, 404, 405, 406, 323; 427/212
See application file for complete search history.

(56) References Cited

U.S. PATENT DOCUMENTS

| | | | |
|---|---|---|---|
| 4,623,738 A | 11/1986 | Sugerman et al. | |
| 4,634,785 A | 1/1987 | Sugerman et al. | |
| 5,421,864 A | 6/1995 | Chiba et al. | |
| 5,665,511 A | 9/1997 | Takashi et al. | |
| 5,681,883 A | 10/1997 | Hill et al. | |
| 6,160,042 A | 12/2000 | Ishida | |
| 6,162,849 A | 12/2000 | Zhuo et al. | |
| 6,436,413 B1 * | 8/2002 | Gers-Barlag et al. | 424/401 |
| 6,645,612 B2 | 11/2003 | Pujari et al. | |
| 6,652,822 B2 | 11/2003 | Phillips et al. | |
| 6,913,827 B2 | 7/2005 | George et al. | |
| 7,255,735 B2 * | 8/2007 | Meyer et al. | 106/445 |
| 2004/0007764 A1 | 1/2004 | Jang | |
| 2004/0220419 A1 | 11/2004 | Gottschalk-Gaudig et al. | |
| 2005/0041373 A1 | 2/2005 | Pruss et al. | |
| 2005/0153124 A1 | 7/2005 | Finn et al. | |

FOREIGN PATENT DOCUMENTS

| | | |
|---|---|---|
| EP | 0198374 A | 10/1986 |
| EP | 424094 A | 4/1991 |
| JP | 05-051540 | 2/1993 |
| JP | 05-051557 | 3/1993 |
| JP | 1993051540 | 3/1993 |
| JP | 07-215705 | 8/1995 |

* cited by examiner

*Primary Examiner*—Leszek Kiliman
(74) *Attorney, Agent, or Firm*—Joseph E. Waters

(57) ABSTRACT

A boron nitride composition having its surface treated with a coating layer comprising at least an organosilicon compound. In one embodiment, the boron nitride powder surface is first treated by either a calcination process, or by coating with at least an inorganic compound for the surface to have a plurality of reactive sites containing at least a functional group that is reactive to at least one functional group of the organosilicon compound.

20 Claims, No Drawings

ENHANCED BORON NITRIDE COMPOSITION AND COMPOSITIONS MADE THEREWITH

CROSS-REFERENCE TO RELATED APPLICATIONS

This application claims the benefits of U.S. Patent Application Ser. No. 60/828,649 filed Oct. 8, 2006, which patent application is fully incorporated herein by reference.

FIELD OF THE INVENTION

The present invention relates to a boron nitride composition, for use in applications including forming polymer-based compositions or mixtures containing the boron nitride.

BACKGROUND OF THE INVENTION

Boron nitride ("BN") comes in a variety of crystalline structures and has a variety of uses from polishing agents to lubricants. Hexagonal boron nitride ("hBN") has a hexagonal layer structure similar to graphite. Because of its properties, it has found uses in heat conductivity applications, electrical insulation applications, corrosion resistance applications, lubrication applications, personal care applications, and as a plastic additive. In the prior art, white powders of BN particles with platelet morphology and hexagonal structure similar to that of graphite may be manufactured in a high temperature reaction from inorganic raw materials.

Because of h-BN particles' platelet morphology, polymer compositions containing h-BN particles usually have much higher viscosities than ones containing spherical alumina of comparable volume loadings. When platelet BN is added as a filler to a polymer, a blended material is formed having poor rheological properties. At loadings above 30 wt. % BN, the blended material is so viscous that it is difficult to dispense it from a mechanical dispenser such as a syringe. Particle settlement is also more pronounced in hBN-filled silicone composites than in alumina-filled ones, even though hBN has a much lower density than alumina. To alleviate both the viscosity and the filler separation problems, surface treatment of hBN has been tried.

U.S. Pat. No. 6,731,088 discloses a process to manufacture BN, forming a dry powder of spherically shaped agglomerates of irregular non-spherical particles bound together by a binder and subsequently spray-dried. The spherically shaped BN agglomerates can be combined with polymers at levels of 35-50 wt. % to form compositions with viscosity below about 300 cp. JP Publication No. 05-051540 discloses BN powder treated with at least a titanate coupling agent, a silane coupling agent, and a non-inonic coupling agent in an amount of 0.1 to 5 wt. %, to improve the wettability of the BN in applications such as a release agent, a lubricant, a low-friction material, a coating material, etc. U.S. Pat. No. 6,162,849 discloses a thermally conductive moldable polymer blend having at least 60 wt. % of BN powder having an average particle size of at least 60 microns and coated with a coupling agent, and wherein the thermally conductive composition has a thermal conductivity of at least 15 W/m° K.

In addition, BN powder is known to degrade in humid conditions. It may therefore be useful to treat BN powders to render it more hydrophobic.

There is still a need for improved BN compositions, particularly for BN compositions that can be used in large quantities as a filler in applications including but not limited to automotive and electronic applications as well as for BN particles that withstand humid conditions.

BRIEF SUMMARY OF THE INVENTION

In one embodiment, the invention relates to a boron nitride powder having its surface treated with at least one organosilicon compound selected from the group of siloxanes and silazanes.

The invention also relates to method for treating a boron nitride powder by treating its surface with at least a coating layer comprising at least oneorganosilicon compound selected from the group of siloxanes and silazanes.

DETAILED DESCRIPTION OF THE INVENTION

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

As used herein, the term "functionalized" may be used interchangeably with "surface functionalized," "functionalized surface," "coated," "surface treated," or "treated," referring to the coating of the boron nitride component in agglomerate form or platelet form with the coupling agent of the invention.

As used herein, "coupling agent" may be used interchangeably with "coating compound," "coating composition" or "functionalization agent." The silicone compound for use as the coupling agent is selected based on the final application, e.g., personal care, thermal management, polymer matrix, tire application, etc. where the BN is to be used.

As used herein the term "functionalization" or "functionalized" relates to modification of the BN surface to provide a plurality of functional groups on the BN surface. A "functionalized surface" as used herein refers to the coating that has been modified so that a plurality of functional groups are covalently attached thereto, either directly or indirectly. In one embodiment, the BN particles have their surfaces functionalized by at least one organosiloxane compound having the formula (RR'SiO—)n, where R, R' are the same or different and are selected from the group of H, alkyl (linear or branched), aryl and substituted aryl; n has a value ranging from 3-16 for cyclic compounds and 2 to 1 million for linear compounds. In another embodiment, the BN particles are treated with a silazane of the general formula $HN(SiR_3)(SiR'_3)$ where R or R' may be the same or different and are selected from the group of H, linear or branched alky, aryl and substituted aryl. In yet another embodiment, the BN particles are treated with a silazane of the general formula $H_2N(SiR_3)$ where R is selected from the group of H, linear or branched alky, aryl and substituted aryl.

Boron Nitride Component. As the starting material, the uncoated BN component comprises crystalline or partially crystalline boron nitride particles made by processes known in the art. These include spherical BN particles in the micron size range produced in a process utilizing a plasma gas as disclosed in U.S. Pat. No. 6,652,822; hBN powder comprising spherical boron nitride agglomerates is formed from irregular non-spherical BN particles bound together by a binder and subsequently spray-dried, as disclosed in US Patent Publication No. US2001/0021740; BN powder produced from a pressing process as disclosed in U.S. Pat. Nos. 5,898,009 and 6,048,511; BN agglomerated powder as disclosed in US Patent Publication No. 2005.0041373; BN powder having high thermal diffusivity as disclosed in US Patent Publication No. US20040208812A1; and highly delaminated BN powder as disclosed in U.S. Pat. No. 6,951,583. These also include BN particles of the platelet morphology.

In one embodiment, the BN powder has an average particle size of at least 50 microns (μm). In another embodiment, the BN powder has an average particle size of 5 to 500 μm. In a third embodiment, from 10 to 100 μm. In a fourth embodiment, the BN powder has an average particle size of 1 to 30 μm. In one embodiment, the BN powder comprises irregularly shaped agglomerates of hBN platelets, having an average particle size of above 10 μm.

In another embodiment, the BN powder is in the form of spherical agglomerates of hBN platelets. In one embodiment of spherical BN powder, the agglomerates have an average agglomerate size distribution (ASD) or diameter from 10 to 500 μm. In another embodiment, the BN powder is in the form of spherical agglomerates having an ASD in the range of 30 to 125 μm. In one embodiment, the ASD is 74 to 100 microns. In another embodiment, 10 to 40 μm.

In one embodiment, the BN powder is in the form of platelets having an average length along the b-axis of at least about 1 micron, and typically between about 1 and 20 μm, and a thickness of no more than about 5 microns. In another embodiment, the powder is in the form of platelets having an average aspect ratio of from about 50 to about 300.

In one embodiment, the BN is an h-BN powder having a highly ordered hexagonal structure with a crystallization index of at least 0.12. In another embodiment, the BN powder has a crystallinity of about 0.20 to about 0.55, and in yet another embodiment, from about 0.30 to about 0.55. In yet another embodiment, the BN has a crystallization index of at least 0.55.

In applications wherein the BN powder is to be used as fillers in polymer composites, e.g., microprocessor packaging requiring high thermal conductivity properties, 10 to 40 vol. % of the BN powder display an average particle size of about 5 to 25 μm; about 60 to 90 vol. % of the particles display an average particle size of about 40 to 80 μm.

In one embodiment and prior to being functionalized, the BN powder is dried in a forced air oven maintained at about 300° F. for at least 6 hrs. and then kept at 120° F. before being treated or before mixing. In another embodiment prior to being functionalized, the BN is sintered at a temperature of at least 1800° C. for about 1 to 4 hrs. Suitable atmospheres for sintering include inert gases such as nitrogen and argon. In one embodiment, the sintering is carried out in a vacuum. In yet another embodiment, the starting hBN particles are first washed by an aqueous solution of 2% glacial acetic acid to remove residual surface contaminants from powder processing. Typically, 5-10 wt. % BN solids are suspended in water to effect the washing. The mixture is stirred at 80-100° C. for a few hours, then vacuum filtered. The BN particles may then be washed again with fresh deionized water before being dried in air circulating oven at 110° C. prior to being functionalized/coated in the next step.

Optional Calcining to Increase the Reactive Sites on the BN Surface: In one embodiment, uncoated BN powder particles are calcined at a sufficiently high temperature for a sufficient period of time for to increase the number of oxygen atoms in the BN by at least 100%. In another embodiment, the BN powder particles are calcined for a sufficient period of time to obtain a powder comprising at least 1% of oxygen atom. In a third embodiment, the BN powder particles are calcined for a sufficient of time and at a sufficient temperature so that the elemental composition of the treated powder has at least 3% oxygen atoms. As means of calcination, electric furnace, gas furnace, rotary kiln and continuous furnace can be employed in so far as an oxidizing environment (e.g., air) is ensured.

In one embodiment, the calcination of spherical BN powder is for at least 8 hours and at a minimum of 850° C., as graphically illustrated below to increase the surface oxidation, allowing increased reactive sites on the BN surface for further functionalization with an organosiliconcompound:

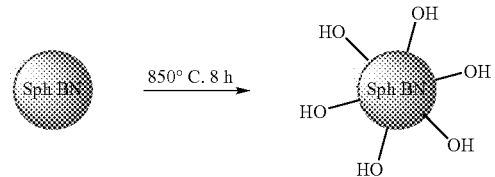

Optional Milling to Increase the Reactive Sites on the BN Surface: In a second embodiment, in addition to or in place of an optional calcination step to oxidize the surface layer of BN particles to create reactive sites, the BN particles are milled via conventional equipment to expose sites that could better react with the organosilicon compound. In one embodiment, the BN particles are milled in a jet milling process, generating a hBN powder in the form of platelets between 0.1 to 60 microns in size. The size is nominal, since each particle is not of such size, but a conglomerate of loosely bonded ultrafine, submicron crystallites.

Optional Coating to Increase the Reactive Sites on the BN Surface: In one embodiment, the BN powder is first coated with at least one metal oxide or hydroxide. Examples include alumina, silica, zirconia, boria, titania, ceria, germania, tantalum oxide, cesium oxide, yttrium oxide, colloidal yttria, magnesia, thoria, phosphate, and mixtures thereof, in an amount ranging from 0.5 to about 10 wt. % of the inorganic compound to the BN powder. In one embodiment, the 1$^{st}$ coating material comprises silicon oxides derived from discrete colloidal silica particles averaging 10 to 100 nm in size. In a second embodiment, the BN particles are wet coated with an aqueous solution of colloidal silica particles with average particle sizes ranging from 20 to 50 nm.

In one embodiment, the 1$^{st}$ coating material is selected from the group of metal acetates, metal nitrates, metal sulfates, and mixtures thereof. In one embodiment, the BN is coated with about 1 to about 5 wt. % of the inorganic compound. In some embodiments, these materials decompose upon heat-treatment to form oxides and to create reactive sites. In one embodiment, the 1$^{st}$ coating material is selected from the group of calcium acetate, calcium sulfate, and calcium nitrate, which upondecomposition result in a coating of calcium oxide with increased number of reactive sites on the BN surface. In another embodiment, the 1$^{st}$ coating material is selected from at least one of aluminum sulfate, aluminum propoxide, aluminum silicate, sodium aluminate, aluminum acetate, and the like, which decompose upon sintering to form an alpha aluminum oxide coating on the surface of BN particles with an increase number of reactive sites.

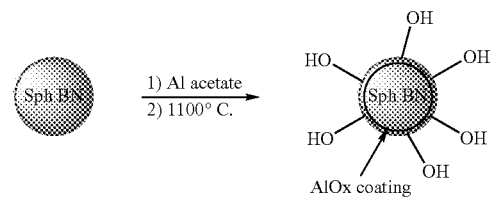

Surface Functionalizing BN with a Coupling Agent: The BN powder (either uncoated or optionally coated with a 1$^{st}$ coating layer) is coated or functionalized with at least one organosilicon compound selected from the group of siloxanes and silazanes.

In one embodiment, the organosiloxane compound is of the formula (RR'SiO—)n, wherein R, R' are the same or different and selected from: H, alkyl (linear or branched), aryl and substituted aryl. The compound may be in the form of a linear structure, a cyclic structure, or a composite linear/cyclic structure. For cyclic siloxanes, n has a value ranging from 3-16; whereas for linear siloxanes, n has a value ranging from 2 to 1 million. In one embodiment, the organosiloxane compound in a linear structure form has the formula:

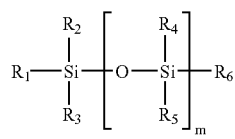

where $R_1$, $R_2$, $R_3$, $R_4$, $R_5$, and $R_6$ are independently methyl or phenyl and m is from 1 to 10. Examples include hexamethyldisiloxane, decamethyltetrasiloxane, diphenyltetramethyldisiloxane, oligo- or polydimethylsiloxane, oligo- or polydiethylsiloxane, oligo- or polyphenylmethylsiloxane, oligo- or polymethylhydrosiloxane, oligo- or polyethylhydrosiloxane, oligo- or polyphenylhydrogen silicone, oligo- or polymethylethylsiloxane, oligo- or polyphenylethylsiloxane, oligo- or polydiphenysiloxane, oligo- or polymethyltrifluoropropylsiloxane, oligo- or polyethyltrifluoropropylsiloxane, tetrachlorophenylmethyl silicone, tetrachlorophenylethyl silicone, tetrachlorophenylhydrogen silicone, tetrachlorophenylphenyl silicone, oligo- or polymethylvinylsiloxnane, and oligo or polyethylvinylsiloxane.

The organosiloxane compound need not be linear, but may be cyclic. Example of organosiloxane compounds in a cyclic structure form include those of the formula

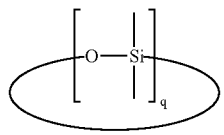

where q is from 2 to 10. Particular examples include hexamethylcyclotrisiloxane ($D_3$), octamethylcyclotetrasiloxane ($D_4$), decamethylcyclopentasiloxane ($D_5$), hexaphenyl cyclotrisiloxane($D^{Ph}_3$), octaphenylcyclotetrasiloxane ($D^{Ph}_4$), tetramethylcyclotetrasiloxane ($D^H_4$) and pentamethylcyclopentasiloxane ($D^H_5$). Mixtures of linear and cyclic compounds may also be used as couplings agents, as may organosiloxanes with other functional groups. In one embodiment, the coupling agent is selected from the group of hexamethylcyclotrisiloxane ($D_3$), trimethylcyclotrisiloxane (($D^H_3$), octamethylcyclotetrasiloxane ($D_4$), tetramethylcyclotetrasiloxane ($D^H_4$), decamethylcyclopentasiloxane ($D_5$), pentamethylcyclopentasiloxane ($D^H_5$). In another embodiment, the coupling agent is selected from linear or cyclo siloxane compounds containing at least one Si—H bond.

In one embodiment, the organosilicon compound is a silazane of the formula $NH_n(SiR_1R_2R_3)_{3-n}$ where $R_1$, $R_2$, $R_3$ is a hydrocarbyl group or H, n is 1 or 2, in the form of a linear structure, a cyclic structure, or a composite linear/cyclic structure. Particular examples include hexamethyldisilazane or tetramethyldisilazane.

In one embodiment, one or more methyl groups in the organosilicon compound may be substituted with one or more functional groups or moieties, to further increase the hydrophobic characteristics of the BN particles coated by the coupling agent of the invention. Particular examples of the functional groups include flurocarbyl such as trifluoropropyl, and perfluoropropyl.

The organosilicon coupling compound may be applied to the BN neat (i.e., in the absence of a carrier or other co-feed), or with an organic carrier. These organosilicon compounds may be used in gaseous, liquid or solid form. The solid organosilicon compounds may be first dissolved in a liquid carrier before being applied to the BN particles.

In one embodiment, initiators, dispersants, defoaming agents, adhesion promoters and other common additives may be optionally combined with the coupling agent. Initiator examples include thermal initiators, chemical initiators, electron beam initiators, and photoinitiators.

The amount of coupling agent used to functionalize the BN of the invention depends on the coating method and the final end-use application. In one embodiment, a sufficient amount of coupling agent is used to get a single layer of silicone coating on the surface of the BN particles. In one embodiment, a sufficient amount of organosilicon compound is used to coat at least 30% of the surface of the BN particles. In yet another embodiment, the coatings on the BN surface are multi-layers.

In one embodiment, the BN is coated via contact with a feed stream containing the coupling compound under vapor phase conditions. In a second embodiment, the BN is mixed with the coupling compound for a sufficient amount of time and optionally heated to a sufficient temperature to facilitate the functionalization process. In a third embodiment, the coupling agent is used in an amount of 2 to 30 wt. % of the BN to be treated. In another embodiment, the organosilicon coupling agent is used in an amount of 5 to 15 wt. % of the BN to be treated.

Method for Preparing the BN Composition There are various methods for preparing the BN composition of the invention, wherein the coupling agent is applied as a liquid or a vapor.

In one embodiment, BN particles are mixed with the organosiliconcoupling agent at a temperature in the range from 25 to 200° C. for 30 minutes to 2 hrs. In one embodiment, the mixing temperature is >60° C. In a second embodiment, in a range of 90 to 150° C. Mixing can be carried out using equipment known in the art, e.g., a two-roll mill mixer, a Banbury mixer, or a Haake or Brabender mixer. After mixing, the materials are optionally treated in a solvent and the solvent is subsequently removed. The solvent can be organic solvents orwater. Examples of organic solvents include aromatic solvents such as toluene, xylene, and the like; hydrocarbon solvents such as hexanes, octanes, and the like; esters such as ethyl acetate, butyl acetate, and the like; and ethers such as ethyl ether and the like, alcohols such as ethanol and the like. In one embodiment, the solvent is used in an amount of 30-3000 parts by weight based on 100 parts by weight of the coupling agent.

In another embodiment of a functionalization process, the coupling compound is applied onto the BN surface as a vapor, at a temperature of 100-300° C. In yet another embodiment, the BN particles are treated by a gaseous coupling agent at temperatures between 100 and 200° C. When the silicone compound is applied neat, reduced pressures, e.g., from about 0.5 Torr to less than atmospheric, may be used. In one embodiment, the organosilicon coupling agent is applied along with co-fed hydrogen (i.e., $H_2$) and an organic carrier.

The organic carrier may be a hydrocarbon, especially an aromatic hydrocarbon such as toluene, benzene, xylene and trimethylbenzene. The organic carrier may constitute 50-99% of the feedstock.

In one embodiment of the invention, after treatment with the coupling agent, the functionalized BN powder product is further sintered at a temperature of at least about 1600° C. for about 1 to 12 hours to improve the thermal diffusivity, impurity, and crystal structure of the BN. The sintering is typically in the range of 1800° C. to 2400° C. for a few hours in atmospheres including inert gas, nitrogen, and argon. Once the firing (sintering) is complete, the BN product is typically cooled in the furnace where the sintering takes place.

Confirmation of the functionalization of the BN powder by the silicone coupling agent may be made by appropriate analyses of the coated BN powder after the reactionusing techniques such as DRIFT-IR, X-ray photoelectron spectroscopy (XPS) and time-of-flight secondary ion mass spectrometry (TOF-SIMS).

Compositions Containing Surface Functionalized BN: The BN surfaced-functionalized by the method of the invention may be used in a powder form, or incorporate into a paste form of about 60 to 80 wt. % of solid BN in an aqueous or non-aqueous medium of isopropanol, methanol, ethanol and the like. When combined with polymers, the surfaced-functionalized BN in powder or paste form is used in amounts of 10 to 80 wt. % of BN to total weight of the compositions. The resulting composition has thermal conductivities of between 1 and 25 W/mK. Examples of polymeric matrices include polyesters, , phenolics, silicone polymers (e.g., a silicone rubber, a silicone fluid), acrylics, epoxies, polyphenylsulfides (PPS), polycarbonates, polyimides or polysulfones. The polymers may be liquid at room temperature or may be melt-processable. The polymeric compound may be prepared by known techniques using melt-mixing in equipment such as a mill, a Banbury, a Brabender, a single or twin screw extruder, continuous mixers, kneaders, etc.

In one embodiment, the surfaced-functionalized BN is used as a filler in levels of up to 90% to increase thermal conductivity to up to 40 W/mK. In one embodiment, the polymeric matrix comprises an elastomer. Such elastomers include, but are not limited to, homo- or co-polymers of 1,3 butadiene, styrene, isoprene, isobutylene, 2,3-dimethyl-1,3-butadiene, acrylonitrile, ethylene, and propylene. Blends of any of the foregoing may also be used. The elastomeric compositions may include one or more curing agents such as, for example, sulfur, sulfur donors, activators, accelerators, peroxides, and other systems used to effect vulcanization of the elastomer composition. In another embodiment, the polymer matrix comprises at least one of a liquid crystal polymer; a polyester; a polyamide; a polyphthalamide; a polyimide; a polyphenylene sulfide; a polycarbonate; a polyetheretherketone; a polyaryletherketone; a polyarylene sulfide; a polyphenylene oxide; and mixtures thereof.

Applications and Articles Employing Surface Functionalized BN: In one embodiment, the surface-functionalized BN allows the loading concentration of BN to be raised with little increases in the viscosity of the composite, relative to the same composite loaded with untreated BN; thereby either providing enhanced thermal conductivity and lower viscosity or reducing the viscosity of the filled polymer composite to enhance its processability. In one embodiment, when the surface-functionalized BN powder is blended into a polymer, the viscosity of the resulting polymeric composite is lowered by at least 20% when compared to viscosity of a polymeric composition containing the same amount of boron nitride powder not surface-functionalized with the organosilicon agent. In another embodiment, when the surface-functionalized BN composition is blended into a polymer in an amount of greater than 20 wt. %, the viscosity of the resulting composite is at least 50% lower than that of the composition containing an equivalent amount of untreated BN powder.

Polymer composites comprising the BN powder functionalized with the organosilicon coupling agent of the invention may be used for applications ranging from personal care such as shampoos, lotions, creams, to industrial applications such as articles, sheets, films, parts, for use in microprocessor packaging, automotive parts and components, tires, bearing housings, heat-exchanger applications such as heat sinks for microprocessors and integrated circuit chips, plastic ball grid array packages, quad flat packs, and other common surface-mounted integrated circuit packages, etc., particularly applications demanding a high thermal conductivity which is close to that of pure alumina (about 25 W/m° K).

EXAMPLES

Examples are provided herein to illustrate the invention but are not intended to limit the scope of the invention.

In the examples, BN powder is commercially available from General Electric Company, Quartz business located in Cleveland, Ohio, as PTX60 (spherical agglomerates of hexagonal platelet BN with an average particle size of 60 microns); PT120 (hexagonal platelet BN having an average particle size of 12 microns); and PT110 (hexagonal platelet BN having an average particle size of 45 microns). Starting BN powder has an oxygen level of less than 0.4%, Example 1

In this example, large excess of cyclic siloxane tetramethylcyclotetrasiloxane $D_4^H$ (10.1 g) is mixed with PTX60 (2.25 g) and heated in a 120° C. oven over 72 hours, forming large agglomerates. Using Scanning Electron Microscopy (SEM), Si is detected on the surface of BN, with an accumulative loss of 6% mass between room temperature and 800° C. (result by TGA)

Example 2

In this example, a lower amount of tetramethycyclotetrasiloxane $D_4^H$ is used for surface functionalization, e.g., 4.2 g of $D_4$ is mixed with 10.1 g of PTX60 and heated in a 110° C. oven for 2.5 hours. The mixture is next washed with hexane and dried. Dynamic Head Space Desportion Test on the resultant powder shows evolution of cyclic siloxanes. TGA indicates an accumulative mass loss of 5.5% between room temperature and 600° C. The dried powder is put into a flask of water,shaken, and let sit still. The functionalized PTX60 powder is suspended in water and shaken. Approximately 30 seconds after shaking is stopped, the treated BN powders separated from the water layer, forming a clear BN toplayer and a clear water lower layer. This suggeststhat the functionalized BN of the invention repels water very well.

Example 3

1.642 g PT120 is heated with 0.117 g succinic-anhydride-functionalized ethoxysilane in refluxing tetrahydrofuran (THF) overnight. The mixture is filtered and washed with additional THF. ~0.4 g of the compound is suspended in 10.5 mL water, and measured to have a p.H of ~5~vs. p.H ~8 for untreated ones at similar loading. DRIFT analysis confirms the presence of new surface hydrocarbon groups on the BN.

Comparative Example 1

In this example, PT120 BN powder from GE Advanced Ceramics is stirred in acidified isopropanol for 4 days at room temperature then for 30 hours @60° C. The alcohol-treated BN powders does not show any significant improvement in hydrophobicity (shaking with water).

Comparative Example 2

In this example, untreated PTX60 is mixed with water and shaken. 10 minutes after shaking is stopped, BN still forms cloudy suspension in the water, showing that untreated BN powder does not repel water as well as the treated one in Example 2.

Comparative Example 3

0.456 g of solidified octylisocyanate is heated with 3.95 g of PT120 boron nitride powder suspended in 21 g tetrahydrofuran at 55° C. for 60 hours. Afterwards, the mixture is filtered, washed and dried in oven. The treated powder shows improved water immiscibility over untreated boron nitride powder. However, after the treated powder is shaken water, it forms cloudy suspension 30 seconds after shaking is stopped, suggesting that the treated powder does not repel water as efficiently as the treated powder in Example 2.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A boron nitride composition comprising boron nitride powder, the boron nitride powder having its surface treated with at least an organosilicon compound having a formula selected from:
   a. (RR'SiO—)n, where R, R' are the same or different and selected from the group of H, alkyl, aryl and substituted aryl; n has a value ranging from 3-16 for cyclic compounds and 1 to 2 million for linear compounds; and
   b. $NH_n(SiR_1R_2R_3)_{3-n}$ where $R_1$, $R_2$, $R_3$ is a hydrocarbyl group or H, n is 1 or 2.

2. The boron nitride composition of claim 1, wherein the organosilicon compound is selected from the group of hexamethylcyclotrisiloxane ($D_3$), trimethylcyclotrisiloxane (($D_3^H$), octamethylcyclotetrasiloxane ($D_4$), tetramethylcyclotetrasiloxane ($D_4^H$), decamethylcyclopentasiloxane ($D_5$), pentamethylcyclopentasiloxane ($D_5^H$).

3. The boron nitride composition of claim 1, wherein the organosilicon comprises $NH_n(SiR_1R_2R_3)_{3-n}$ where $R_1$, $R_2$, $R_3$ is a hydrocarbyl group or H, n is 1 or 2.

4. The boron nitride composition of claim 1, wherein the boron nitride powder surface is first treated for the surface to have a plurality of reactive sites containing at least a functional group that is reactive to at least one functional group of the organosilicon compound.

5. The boron nitride composition of claim 1, wherein the boron nitride powder is first treated by a calcination process.

6. The boron nitride composition of claim 1, wherein the boron nitride powder is first treated by coating the boron nitride powder with an inorganic compound.

7. The boron nitride composition of claim 6, wherein the boron nitride powder is first treated by coating the boron nitride powder with at least one of a metal oxide and hydroxide.

8. The boron nitride composition of claim 7, wherein the boron nitride powder is first treated by coating the boron nitride powder with at least one of alumina, silica, zirconia, boria, titania, ceria, germania, tantalum oxide, cesium oxide, yttrium oxide, colloidal yttria, magnesia, thoria, phosphate, and mixtures thereof.

9. The boron nitride composition of claim 7, wherein boron nitride powder is first treated by coating the boron nitride powder with 0.5 to about 10 wt. % of an inorganic compound selected from the group of metal oxides and hydroxides.

10. The boron nitride composition of claim 1, wherein the boron nitride powder has an average particle size of at least 50 microns.

11. The boron nitride composition of claim 1, wherein the boron nitride powder comprises spherically shaped agglomerates of irregular non-spherical particles bound together by a binder and subsequently spray-dried.

12. The boron nitride composition of claim 1, wherein the boron nitride powder comprises hexagonal boron nitride platelets having an aspect ratio of from about 50 to about 300.

13. The boron nitride composition of claim 1, wherein the boron nitride powder comprises hexagonal boron nitride platelets having an average diameter of from about 2 μm to about 20 μm.

14. The boron nitride composition of claim 1, wherein the boron nitride powder comprises irregularly shaped agglomerates of hexagonal boron nitride platelets, having an average particle size of above 10 microns.

15. An article comprising the boron nitride composition of claim 1.

16. A polymer composite comprising a polymer matrix selected from the group consisting of melt-processable polymers and cured polymers, and a filler material comprising particles of boron nitride, the boron nitride having its surface treated with at least an organosilicon compound selected from the group consisting of siloxanes and silazanes.

17. The polymer composite of claim 16, wherein the polymer matrix is selected from the group of phenolics and epoxies.

18. The polymer composite of claim 16, wherein the polymer matrix comprises a silicone resin.

19. The polymer composite of claim 16, wherein the polymer matrix comprises at least one of a liquid crystal polymer; a polyester polyethylene terephthalate, polybutylene terephthalate; a polyamide; a polyimide; a polyphthalamide; a polyphenylene sulfide; a polycarbonate; a polyetheretherketone; apolyaryletherketone; a polyphenylene oxide; and a mixture thereof.

20. A method for producing boron nitride powder, comprising the steps of:
   a. introducing a plurality of reactive sites on at least a portion of the boron nitride; and
   b. coating the boron nitride with at least an organosilicon compound selected from the group of siloxanes and silazanes, wherein the organosilicon compound has at least a functional group that is reactive to at least one reactive site on the boron nitride.

* * * * *